US008883268B2

(12) United States Patent
Braune et al.

(10) Patent No.: US 8,883,268 B2

(45) Date of Patent: Nov. 11, 2014

(54) METHOD AND DEVICE FOR PRODUCING A PARYLENE COATING

(75) Inventors: Bert Braune, Wenzenbach (DE); Christina Keith, Neutraubling (DE); Ivan Galesic, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 103 days.

(21) Appl. No.: 13/583,755

(22) PCT Filed: Mar. 8, 2011

(86) PCT No.: PCT/EP2011/053475

§ 371 (c)(1),
(2), (4) Date: Jan. 28, 2013

(87) PCT Pub. No.: WO2011/110564

PCT Pub. Date: Sep. 15, 2011

(65) Prior Publication Data

US 2013/0189447 A1 Jul. 25, 2013

(30) Foreign Application Priority Data

Mar. 10, 2010 (DE) ........................ 10 2010 010 819

(51) Int. Cl.

*B05D 1/00* (2006.01)
*B05D 3/14* (2006.01)
*H01L 51/52* (2006.01)

(52) U.S. Cl.

CPC .. *B05D 1/60* (2013.01); *B05D 1/62* (2013.01); *B05D 3/142* (2013.01); *H01L 51/5253* (2013.01)

USPC ........................................ 427/569; 427/255.6

(58) Field of Classification Search

None

See application file for complete search history.

(56) References Cited

U.S. PATENT DOCUMENTS

| | | | | |
|---|---|---|---|---|
| 5,121,706 | A | 6/1992 | Nichols et al. | |
| 5,928,527 | A | 7/1999 | Li et al. | |
| 6,110,537 | A | 8/2000 | Heffner et al. | |
| 6,165,554 | A | 12/2000 | Halpern et al. | |
| 2002/0097295 | A1 | 7/2002 | Toda et al. | |
| 2005/0130422 | A1 | 6/2005 | Theiss | |
| 2008/0306592 | A1 * | 12/2008 | Wang | 623/11.11 |
| 2009/0263641 | A1 | 10/2009 | Martin, III et al. | |
| 2011/0038131 | A1 * | 2/2011 | Hogg et al. | 361/757 |
| 2011/0293832 | A1 | 12/2011 | Gersdorff et al. | |

FOREIGN PATENT DOCUMENTS

| | | | |
|---|---|---|---|
| DE | 10 2008 026 9 | | 12/2009 |
| KR | 100675806 | B1 | 1/2007 |
| WO | 2005/110626 | A2 | 11/2005 |
| WO | WO 2011/033208 | * | 3/2011 |

OTHER PUBLICATIONS

Jérôme Charmet et al., "Liquid as template for next generation micro devices," Journal of Physics: Conference Series—Porcesses in Isotopes and Molecules, vol. 182, No. 1, 2009, pp. 1-4.

* cited by examiner

*Primary Examiner* — Jospeh Miller, Jr.

(74) *Attorney, Agent, or Firm* — DLA Piper LLP (US)

(57) ABSTRACT

A method of producing a parylene coating on at least one surface of at least one component includes providing a first gas containing parylene monomers and depositing the parylene monomers on the at least one surface of the component by supplying the first gas containing the parylene monomers by a first nozzle to the at least one surface, wherein the component is disposed in an environment at atmospheric pressure.

10 Claims, 4 Drawing Sheets

METHOD AND DEVICE FOR PRODUCING A PARYLENE COATING

RELATED APPLICATIONS

This is a §371 of International Application No. PCT/EP2011/053475, with an international filing date of Mar. 8, 2011 (WO 2011/110564 A1, published Sep. 15, 2011), which is based on German Patent Application No. 10 2010 010 819.7, filed Mar. 10, 2010, the subject matter of which is incorporated by reference.

TECHNICAL FIELD

This disclosure relates a method and a device for producing a parylene coating.

BACKGROUND

Corrosive gases such as, for example, sulphur compounds lead to corrosion of sensitive surfaces of electrical components, for example, in the case of optoelectronic components. Thus, silver surfaces, for example, of optoelectronic components can corrode as a result of such gases and thus lead to the failure of the components.

There are furthermore applications that necessitate the use of silicone as an encapsulant for surrounding an electrical component such as, for example, an optoelectronic component. Silicones, however, typically have a more or less high permeability to corrosive gases. A modification of silicones, for example, an increased incorporation of phenyl groups, can indeed lower permeability. However, even such modified silicones offer no adequate long-term stability against corrosion.

Although use of other materials such as, for example, gold instead of easily corroding materials such as, for example, silver, increases stability to corrosion, it is often not possible for reasons of cost.

A material that has a high barrier property and thus a low permeability to corrosive gases is, for example, parylene, which, however, is customarily only applied by vacuum or low-pressure methods. For mass production of electronic components such as, for example, optoelectronic components, known parylene coating methods are therefore unsuitable as the components must be coated in a closed volume and a controlled vacuum or low pressure. This either leads to very long production times or alternatively, in the case of ribbon coating methods, to an economically high technical and financial outlay with regard to the coating plants.

It could therefore be helpful to a method for producing a parylene coating on at least one surface of at least one component. It could further be helpful to provide a device for carrying out such a method.

SUMMARY

We provide a method of producing a parylene coating on at least one surface of at least one component including providing a first gas containing parylene monomers, and depositing the parylene monomers on the at least one surface of the component by supplying the first gas containing the parylene monomers by a first nozzle to the at least one surface, wherein the component is disposed in an environment at atmospheric pressure.

We also provide a method of producing a parylene coating on at least one surface of at least one component including providing a first gas containing parylene monomers, depositing the parylene monomers on the at least one surface of the component by supplying the first gas containing the parylene monomers by a first nozzle to the at least one surface, wherein the component is disposed in an environment at atmospheric pressure, and the parylene monomers containing fluorine-substituted parylene monomers.

We further provide a device for carrying out the method of producing a parylene coating on at least one surface of at least one component including providing a first gas containing parylene monomers, and depositing the parylene monomers on the at least one surface of the component by supplying the first gas containing the parylene monomers by a first nozzle to the at least one surface, wherein the component is disposed in an environment at atmospheric pressure, including a first nozzle which conducts a first gas containing parylene monomers to the at least one surface of the component, and a transport mechanism which moves the at least one component past the first nozzle during supplying of the first gas containing the parylene monomers, wherein the component is disposed in an environment at atmospheric pressure.

We still further provide a device for carrying out the method of producing a parylene coating on at least one surface of at least one component including providing a first gas containing parylene monomers, and depositing the parylene monomers on the at least one surface of the component by supplying the first gas containing the parylene monomers by a first nozzle to the at least one surface, wherein the component is disposed in an environment at atmospheric pressure, including a first nozzle which conducts a first gas containing parylene monomers to the at least one surface of the component, and a transport mechanism which moves the at least one component past the first nozzle during supplying of the first gas containing the parylene monomers, wherein the component is disposed in an environment at atmospheric pressure and a second gas in which a plasma is generated is conducted to the at least one surface as a plasma flow by a second nozzle.

DETAILED DESCRIPTION

Figure 1:
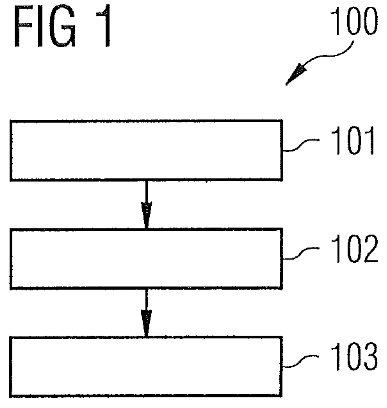
FIG. 1 shows a schematic representation of a method for producing a parylene coating on at least one surface of at least one component.

In our method of producing a parylene coating on at least one surface of at least one component, a first gas containing parylene monomers may be provided. The first gas containing parylene monomers may be conducted by a first nozzle to the at least one surface of the at least one component. The parylene monomers are thus deposited on the at least one surface. The at least one component is disposed in an environment at atmospheric pressure.

In particular, disposition of the component in an environment at atmospheric pressure can mean that the at least one component does not have to be disposed in a closed coating volume or in a coating chamber closed with respect to the environment, in particular, for example, a low-pressure or vacuum chamber, to carry out the method described here. In contrast to known methods for producing parylene coatings, which have to be carried out in closed systems without contact with the environment, the method described here can be carried out in an "open system." The environment at atmospheric pressure can be formed, for example, by a part of a space, for example, of a production facility, a coating laboratory or a production laboratory such that a device for carrying out the method described here and in particular the component to be coated by the device can be in contact with the remaining space during the coating so that a gas and/or air exchange is possible.

A high throughput in the coating of the at least one component and in particular in the coating of a plurality of components can advantageously be achieved, as, for example, carrying out of the method described here in an apparatus designed as a ribbon coating unit is possible. For this purpose, the at least one component and in particular also a plurality of components can be moved past the first nozzle during the supply of the first gas containing the parylene monomers and transported by a transport mechanism without the transport mechanism having to be integrated into a closed vacuum, low-pressure or coating chamber. A comparable mass production of parylene-coated components in the low-pressure method using a special vacuum chamber can only be employed in strip manufacture and thereby does not achieve the number of pieces that can be possible with the method described here, in which the at least one component is disposed in an environment at atmospheric pressure.

The terms parylene, parylenes and parylene polymer designate a group of thermoplastic polymers which contain phenylene radicals linked in the 1,4-position by ethylene bridges and which can also be designated, for example, as poly-para-xylylene. As a starting substance for reactive parylene monomers which, for example, have the structure

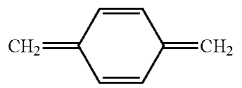

which can also be designated as 1,4-quinodimethane and which can polymerize to give parylene polymers, parylene dimers having the structural formula

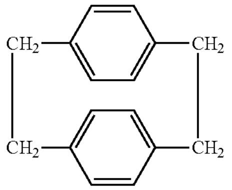 [SMILES: c1cc2ccc1CCc1ccc(cc1)CC2]

can be used, which can also be designated as para-cyclophane or di-para-xylylene.

Instead of the materials with the structural formulae shown, the hydrogen atoms in these can also be substituted at least partially or completely by halogens, for example, by chlorine and/or fluorine atoms. In particular, the parylene monomers and thus also the producible parylene coating, can be fluorine-substituted such that, for example, the parylene monomers can contain $CF_2$ groups instead of the $CH_2$ groups shown above. Such parylenes can be high temperature-stable, that is to say do not degrade mechanically and/or optically at high temperatures such that the at least one component, coated by the method can be further processed, for example, in possible subsequent soldering processes. Such operational conditions can be typical, for example, for components designed as electronic or optoelectronic components, for example, light-emitting diodes (LEDs) or "high-power LEDs."

The parylene coating can advantageously have a low permeability to gases, in particular corrosive gases such as, for example, sulphur compounds. Furthermore, the parylene coating can have a layer thickness homogeneity as well as a high adhesion to the at least one surface. By conducting the parylene monomers with the aid of the first gas to the at least one surface of the at least one component, the parylene monomers can be deposited uniformly on the at least one surface to be coated independently of the surface topography of the at least one surface and polymerized on this. Thereby, using the method described here, by cross-linkage of the parylene monomers on the at least one surface, a parylene coating having a high diffusion barrier action and simultaneously a transparency for light, for example, in the infrared to ultraviolet and in particular in the visible wavelength region can be achieved, which furthermore can also couple chemically to the at least one surface. The high transparency for light of the parylene coating is retained even after thermal stress, for example, by operation of the electrical component and after irradiation by light in an ultraviolet wavelength range, for example, in the case of an electrical component designed as an ultraviolet light-emitting diode. Furthermore, the parylene coating has a high resistance to yellowing as can occur, for example, with silicone coatings.

For the provision of the parylene monomers, parylene dimers can be evaporated at elevated temperatures and cleaved in the gas phase to give parylene monomers which can furthermore be deposited on a surface by condensation from the gas phase and can polymerize on this. For this purpose, the parylene monomers can in particular be evaporated in the first gas and cleaved to give parylene monomers. In particular, the first gas can have atmospheric pressure. Suitable further conditions with respect to the first gas and the necessary temperatures are known to those skilled in the art and are therefore not explained further. The first gas can in particular be designed as a carrying gas for the parylene monomers so that the parylene monomers can be co-transported with the first gas in the gas flow of the first gas.

Furthermore, the parylene monomers can be produced in the first nozzle. For this purpose, the first nozzle, for example, can have a first volume, by which the parylene dimers together with the first gas can be conducted through a separating wall having openings in the direction of a second volume of the first nozzle by a corresponding gas stream of the first gas. The first volume and/or the separating wall with the openings can here have a temperature by which parylene dimers can be cleaved to give parylene monomers so that the first gas is then provided in the second volume using the parylene monomers and can be conducted further to the at least one surface of the at least one component by the first nozzle. In addition to the flowrate and the choice of the first gas in the second volume of the first nozzle the conditions, for example, the temperature or a temperature course can be chosen such that undesired reactions of the parylene monomers within the first nozzle, so-called "side reactions" can be excluded.

Furthermore, a second gas can be conducted to the at least one surface. In the second gas, a plasma can be generated so that the second gas can be conducted to the at least one surface as a plasma flow. In other words, the second gas can be conducted as a flowing, ionized gas that is as a flowing plasma, to the at least one surface. The plasma can be generated, for example, by an arc discharge in the second gas in the first or a second nozzle. For this purpose, the first nozzle or a second nozzle can have one or more electrodes. A device of this type or else an alternative device that generates a plasma in a gas or in a gas stream are known and are not explained further here.

Furthermore, the plasma in the second gas can be an atmospheric plasma. This can mean that the second gas has an atmospheric pressure and the plasma does not have to be generated in a vacuum chamber at a reduced pressure. With this device, the second gas can advantageously be supplied as a plasma flow to the at least one component, which is disposed in an environment at atmospheric pressure. The plasma of the second gas thereby advantageously has a simple applicability, for which no low-pressure chamber is necessary, and can thus be used for the reasons already mentioned further above, for example, also for high-volume production, that is for mass production of a plurality of components.

Furthermore, the plasma above-described can also be generated in the first gas. This can mean that the first gas containing parylene dimers is supplied to the first nozzle and the plasma is produced, for example, by arc discharge in the first gas described above. A plasma flow of the first gas can thereby be produced. Additionally, a second gas can also be supplied such that the plasma can be generated even in a mixture of the first and second gas. Alternatively to this, the plasma can be generated in the second gas in the manner described above and the first gas containing the parylene dimers can be supplied to the plasma of the second gas. As a result of the energy in the plasma of the first and/or second gas, the parylene dimers can be cleaved to give parylene monomers and thus provided in the first nozzle.

The plasma flow of the first and/or second gas can be used to clean the at least one surface and/or coating the at least one surface. In particular, the at least one surface of the component can be chemically activated by the plasma flow. This can in particular mean that free, reactive molecule ends are produced in the first surface which can enter into chemical reaction with the parylene monomers and thus crosslink with these. In particular, the at least one component can have as at least one surface a surface of a silicone coating and/or of a silicone casting. In other words, the at least one surface of the at least one component can be formed by silicone. With the plasma flow of the first and/or second gas, reactive molecule ends can be produced in the silicone which can enter into chemical bonds with the parylene monomers.

Furthermore, the second gas can be conducted as a plasma flow to the at least one surface of the at least one component by a second nozzle in which the plasma is generated. The plasma flow of the second gas can here be conducted to the at least one surface before the first gas containing the parylene monomers are conducted to the at least one surface. For this purpose, the first and second nozzle can, for example, be disposed next to one another and the at least one component can first be transported past the second nozzle and subsequently past the first nozzle. In other words, the first nozzle can be disposed downstream to the second nozzle in the transport direction of the at least one component. Furthermore, the first and second nozzles can be aligned in such a fashion to the at least one surface of the at least one component that the second gas can be conducted as a plasma flow and the first gas containing the parylene monomers can also be conducted simultaneously to the at least one surface such that the plasma flow of the second gas and the gas stream of the first gas containing the parylene monomers overlap on the at least one surface. With this device, for example, the temperature of the first gas containing the parylene monomers outside of the first nozzle can advantageously be increased or kept high by the plasma flow of the second gas such that it can be ensured that the parylene monomers do not enter into reactions in the gas stream of the first gas, but only on the at least one surface and can cross-link and polymerize there to give the parylene coating.

Furthermore, the first gas containing the parylene monomers can be provided outside of the first nozzle. For this purpose, an evaporator element can be provided in which parylene dimers in a gas atmosphere with the first gas are evaporated and cleaved. With the first gas, the parylene monomers can be transported from the evaporator element to the first nozzle. In the second gas, the plasma can furthermore be generated by the first nozzle such that the second gas can be conducted to the at least one surface by the first nozzle as a plasma flow. The first gas containing the parylene monomers can be supplied to the plasma flow of the second gas in the first nozzle. The first gas containing the parylene monomers can thus be conducted with the plasma flow of the second gas to the at least one surface, whereby in the first nozzle and outside of the first nozzle above the at least one surface, the plasma flow and the gas flow of the first gas can overlap with the parylene monomers, whereby the advantages described above can result. While in known coating methods precursor molecules in a plasma generated by an arc are cleaved in a defined gas stream and converted into reactive ions and molecules, for example, in the production of oxide layers with silane precursors, in the method described here the reactive parylene monomers already provided are supplied with the first gas to the plasma, whereby a better process control can result.

Furthermore, the first and/or the second gas can contain or be air, nitrogen gas, one or more inert gases, in particular, for example, argon, or a combination of these. The first and second gas can in this case be identical, which can advantageously make possible simplified process management. Alternatively to this, the first and second gas can be different and in this case suited to the respective requirements described above with respect to the transport and flow properties of the first gas and the plasma and transport and flow properties of the second gas.

Furthermore, a cover can be disposed above the at least one component. The cover can have a hollow space, which is open in the direction to the at least one component. For example, the cover can be bell-shaped in the form of a covering bell. The hollow space in the cover can thus be a hollow space which is open on half a side and is delimited by one or more walls of the cover.

The first gas containing the parylene monomer can be conducted into the hollow space of the first cover. Furthermore, in the case that a second gas described above is also used, the second gas, in particular the plasma flow of the second gas, can be supplied to the hollow space of the cover. For this purpose, for example, the first and/or the second nozzle can project into the hollow space through a wall of the cover, for example, an upper side of the cover opposite to the component.

The cover can be disposed above the at least one component such that gas, for example, first and/or second gas, can flow out from the hollow space between the cover, in particular at least some of the walls delimiting the hollow space, in particular at least some of the walls delimiting the hollow space, and the component. This means that the cover is disposed at a distance to the at least one component and this does not enclose or surround at least one component. The component can thus on the one hand be disposed in an environment at atmospheric pressure and on the other hand can be protected from harmful environmental influences by the cover and the gas flowing out between the cover and the component. The cover can be of plastic and/or metal.

Furthermore, the at least one component can contain or be a substrate, a semiconductor wafer, an electrical component, an optoelectronic component or pluralities or combinations thereof. For example, the electrical component can comprise or be a resistance, a capacitor, a coil, an integrated circuit (IC), an IC chip or a combination thereof. For example, the optoelectronic component can be radiation-emitting and/or radiation-receiving in an ultraviolet, visible and/or infrared wavelength range and can contain or be, for example, a light-emitting diode (LED), an infrared-emitting diode (IRED), a photodiode (PD), a solar cell (SC), a photo-sensor, a laser diode or pluralities or combinations thereof.

The at least one surface for the aforementioned components can in particular be formed by a metal layer, for example, a silver-containing layer or a silver layer, of the electrical component, for example, an electrode layer.

An optoelectronic component can furthermore also contain an optical element, for example, an optical casting and/or a lens. The optical element can particularly preferably comprise a silicone or be made thereof and form the at least one surface. By this means, the parylene coating can act as a diffusion barrier to corrosive gases which otherwise could penetrate the silicone and damage underlying elements of the component, for example, silver-containing metal layers.

Our device for carrying out a method for producing a parylene coating on at least one surface of at least one component in particular can contain a first nozzle that conducts a first gas containing parylene monomers to the at least one surface of the component. Furthermore, the device has a transport mechanism that moves the at least one component past the nozzle during the supply of the first gas with the parylene monomer, wherein the component is disposed in an environment at atmospheric pressure.

In particular, the transport mechanism can have a transport belt, for example, a conveyor belt or a belt transport unit, for example, in the form of one or more rollers as part of a ribbon-coating unit. Furthermore, the at least one component can have a plurality of components disposed together on a metal band or in a band-like leadframe composite and moved past the first nozzle by the transport mechanism, for example, by rollers. In particular, the at least one component or the plurality of the components can be moved and transported continuously by the transport mechanism. The method described here may thus be carried out as a ribbon-coating process, whereby a high process throughput and mass production can advantageously result.

Furthermore, the device can have a cover above the at least one component, which cover has a hollow space above the at least one component which is open in the direction of the at least one component, in which hollow space the first gas containing the parylene monomer is supplied through the first nozzle and is moved past the at least one component by the transport mechanism.

Furthermore, additionally a second gas in which a plasma is generated can be conducted to the at least one surface as a plasma flow by the first nozzle, wherein the first gas containing the parylene monomer is supplied in the first nozzle to the plasma flow of the second gas. Alternatively, a second gas in which a plasma is generated can be conducted as a plasma flow to the at least one surface by a second nozzle.

The features described in connection with the method also apply equally to the device. This can mean that the device can have one or more features and combinations thereof and means, devices and elements for carrying out the features that are described above in connection with the method. Furthermore, the features and alternatives described in connection with the device also apply equally to the method described above.

Further advantages and advantageous refinements result from the examples described below in connection with the FIGS. 1 to 5.

In the examples and figures, identical or identically acting constituents are in each case provided with the same reference symbols. The elements shown and their size ratios with one another are basically not to be regarded as true to scale, rather individual elements, such as, for example, layers, components, component elements and areas, are shown excessively thick or large-sized for better representability and/or for better understanding.

In FIG. 1, a method 100 for producing a parylene coating on at least one surface of at least one component is shown.

In a first process step 101 of the method 100, a first gas containing parylene monomers is provided. In a further process step 102, the component is provided, which is disposed in an environment at atmospheric pressure and in a further process step 103 the first gas containing the parylene monomers is conducted to its at least one surface by a first nozzle such that the parylene monomers are deposited on the at least one surface.

Further features and examples of the method are illustrated in connection with the devices of the following examples in FIGS. 2 to 5.

Figure 2:
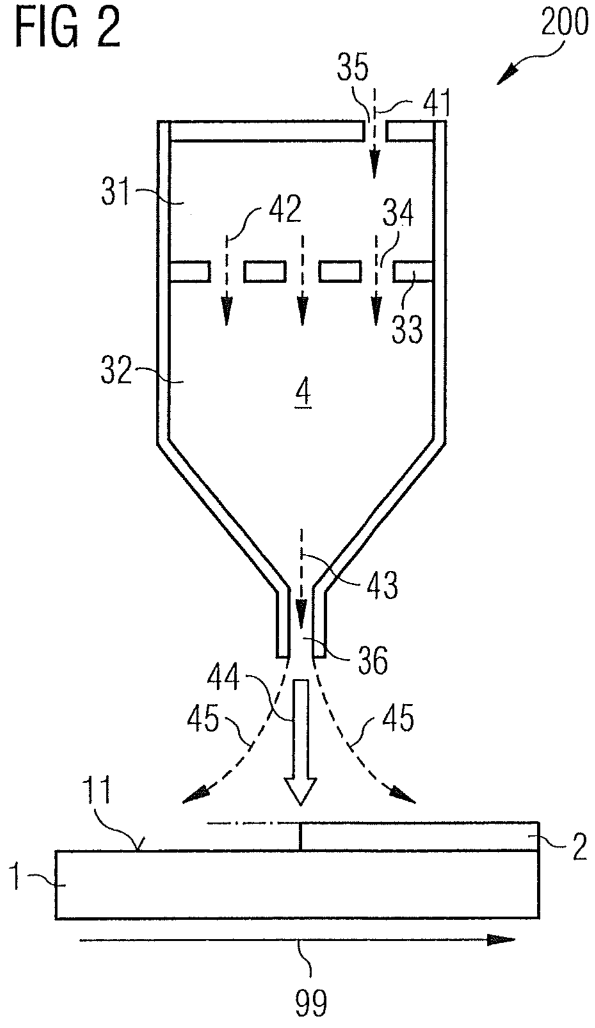
FIG. 2 shows a schematic representation of a device for carrying out a method for producing a parylene coating on at least one surface of at least one component.

In FIG. 2, an example of a device 200 for carrying out the method for producing a parylene coating 2 on at least one surface 11 of at least one component 1 is shown.

In the example shown, the component 1 to be coated is a light-emitting diode (LED) which contains a silicone casting or optical element, for example, a lens of silicone. The at least one surface 11 to be coated is formed here by the silicone. Alternatively or additionally, other or further surfaces can also be coated using the device 200.

Alternatively or additionally to the example described, the surface to be coated can also be formed by a metal layer of component 1, for example, a silver layer which, for example, can serve as an electrode layer.

The component 1 is disposed in an environment at atmospheric pressure and is, in particular together with the device 200, not situated in a closed system such as, for example, a vacuum or low-pressure chamber.

The device 200 has a first nozzle 3 which comprises a first volume 31 and a second volume 32. The first and second volume 31, 32 are separated from one another by a separating wall 33 having openings 34, wherein a gas exchange can take place between the first and second volume 31, 32 through the openings 34.

The first nozzle 3 has a gas inlet 35 for the introduction of a first gas into the first volume 31, as is indicated by the gas flow direction 41. For the sake of clarity, further gas conducting elements such as, for example, pipes, pipelines and tubing are not shown here and not in the following examples either.

The first gas in the example shown is nitrogen gas. Evaporated parylene dimers are already introduced into the first volume 31 outside the first nozzle with the first gas. Alternatively, the parylene dimers, which are solid at the sufficiently low temperatures known to those skilled in the art and can be present, for example, in the form of a powder, are ready disposed in the first volume 31. The first volume 31 then has, for example, as a result of an appropriate heating element a temperature which is sufficient to evaporate at least a part of the parylene dimers in the first volume 31.

The parylene dimers are conducted further through the openings 34 of the separating wall 33 with the first gas, as is indicated by the gas flow direction 42. The separating wall 33 is designed as a heating element or has an appropriate heating element, such that the parylene dimers passing through the openings 34 are cleaved to give parylene monomers. The first gas containing the parylene monomers, denoted below by the reference symbol 4, can thus already be placed in the second volume 32.

The second volume 32 has, for example, a suitable temperature or a suitable temperature profile on account of a heating element, whereby it can be ensured that no undesired reactions of the parylene monomers can take place within the second volume 32 of the first nozzle 3. Such temperature conditions depend on the respective parylene species used and are known. For example, in the example shown, a parylene coating 2 can be prepared, which is formed from fluorine-substituted parylene monomers.

As a result of the first gas continuously flowing in through the gas inlet 35 corresponding to the gas flow direction 41, the first gas containing the parylene monomers 4 can be prevented from flowing back into the first volume 31 of the first nozzle 3, but rather flows out further to the gas outlet opening 36 and through this from the first nozzle 3, as is indicated by the gas flow direction 43.

Alternatively or additionally to the schematic construction of the first nozzle 3 shown, the latter can contain further or differently disposed volumes and/or a different gas routing.

The first gas containing the parylene monomers 4 flowing out from the first nozzle 3, which is indicated by the gas flow direction 45, leads to a supply of the parylene monomers to the at least one surface 11 of the at least one component 1 and to a deposition of the parylene monomers on the at least one surface 11, which is indicated by the arrow 44. The reactive parylene monomers can thereby polymerize on the surface 11. The first gas, optionally together with parylene monomers that do not polymerize on the surface 11, can flow past the surface 11 and the component 1 and can be captured and removed, for example, by a suitable waste gas system.

In the example shown, the at least one component 1 is moved along the transport direction 99 past the first nozzle such that a continuous parylene coating 2 can be applied, which is also indicated by the dotted prolongation of the parylene coating 2.

Alternatively to the example shown, the first nozzle 3 can also be moved relative to the component 1. If the dimensions of component 1 is approximately equal or less than the cross-section of the gas flow direction 45 emerging from the first nozzle 3, the component 1 can even be disposed so as to be stationary relative to the first nozzle 3 during the coating.

Figure 5:
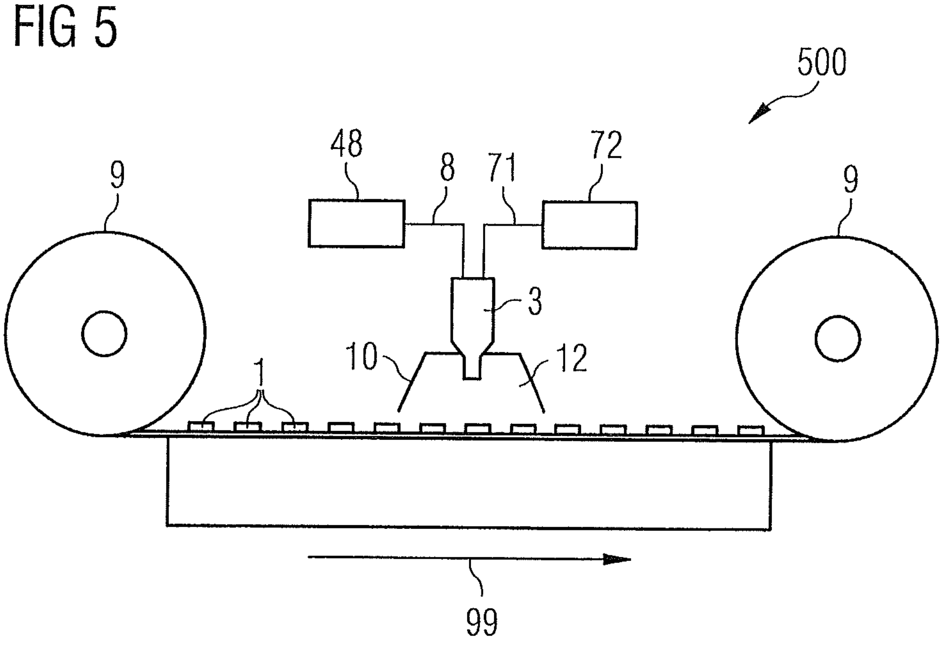

Furthermore, the device 200 can have a cover 10, as is described by way of example in connection with FIG. 5.

In the following examples, modifications and variations of the device 200 according to the example are shown in FIG. 2. The following description is therefore mainly restricted to the differences of the respective devices to the device 200.

Figure 3:
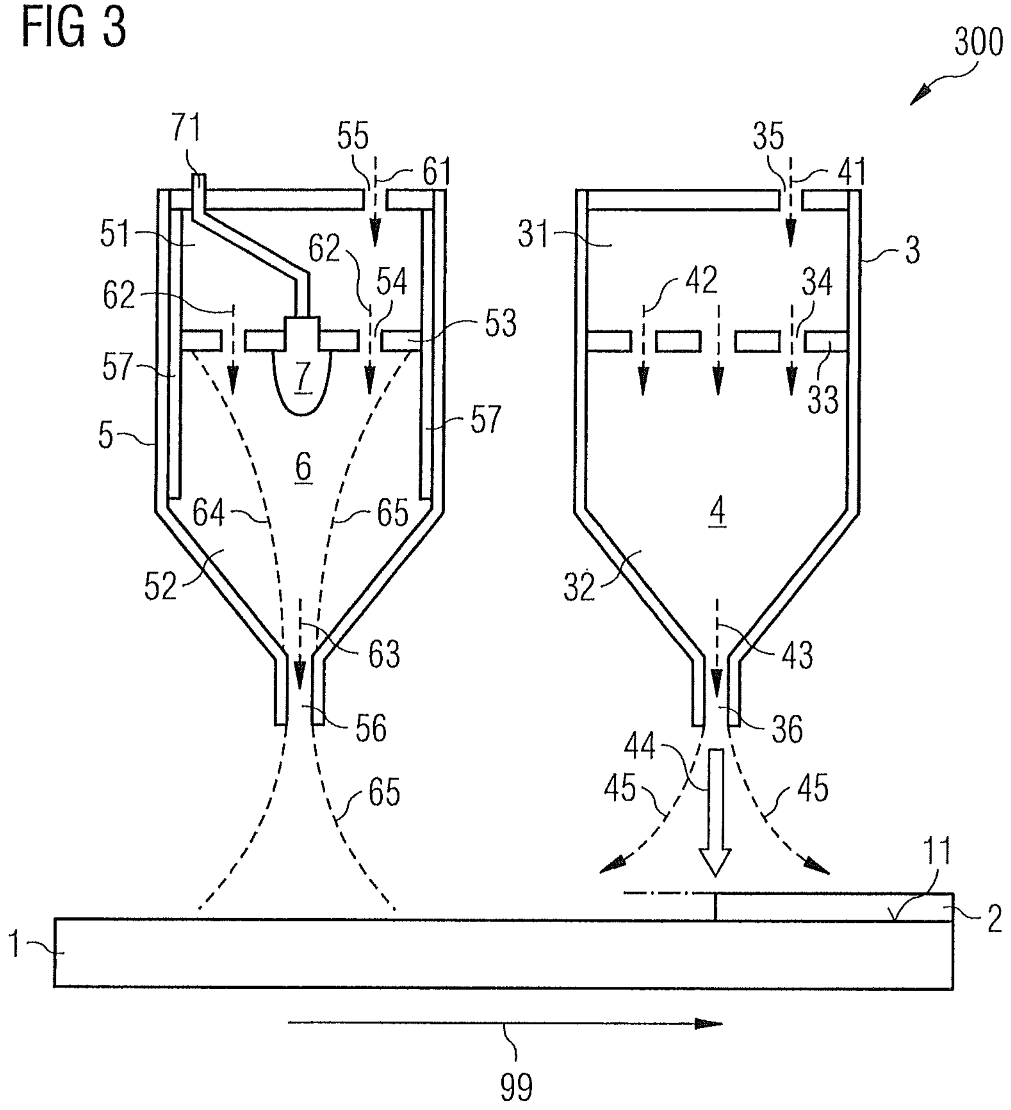
FIGS. 3 to 5 show schematic representations of devices according to further examples.

In FIG. 3, a further example for a device 300 for carrying out a method for producing a parylene coating 2 on at least one surface 11 of at least one component 1 is shown.

The device 300 has a first nozzle 3 designed according to the previous example. Furthermore, the device 300 has a second nozzle 5 adjacent to the first nozzle, wherein the first nozzle 3 is arranged downstream of the second nozzle 5 in the transport direction 99 of the component 1. This means that the at least one surface 11 to be coated is first moved past the second nozzle 5 and then past the first nozzle 3.

The second nozzle 5 has a first volume 51 and a second volume 52, between which is disposed a separating wall 53 having openings 54. A second gas 6, in the example shown nitrogen gas or argon, flows via a gas inlet 55 into the first volume 51, as indicated by the gas flow direction 61, and through the openings 54 of the separating wall 53 into the second volume 52, as is indicated by the gas flow direction 62.

On the electrically insulating separating wall 53, an electrode 7 is disposed in the second volume 52 and attached by an electrical supply 71 to a high-tension source (not shown).

The second nozzle 5 has an electrically earthed housing electrically insulated with respect to the electrode 7 by an electrical insulation 57 in a subarea of the second volume 52. With an are discharge between the electrode 7 and the area of the housing of the second nozzle 5 not covered by the electrical insulation 57, a plasma 64 is generated in the second volume 52 in the second gas 6 and flows into the second volume 52 through the openings 54 of the separating wall 53, as is indicated by the dashed lines. The second gas 6 ionized in the plasma 64 is conducted through a gas outlet 56 of the second nozzle 5 as a plasma flow 65 to the surface 11 of the component 1, as is indicated by the gas flow direction 63.

The plasma flow 65 of the second gas 6 on the one hand makes possible a cleaning of the at least one surface 11 of the component 1. On the other hand, the at least one surface 11 of the component 1 is chemically activated by the plasma flow 65, by generation of reactive molecule ends in the silicone which forms the surface 11, which are then able to enter into chemical bonds with the parylene monomers, which are deposited by the first nozzle 3.

As an alternative to the example shown, the first and the second nozzle 3, 5 can be aligned relative to one another and to the surface 11 so that the plasma flow 65 of the second gas 6 and the first gas containing the parylene monomers 4 are spatially superimposed and thus overlap such that the processes described can take place simultaneously and in the same space and surface region. Additionally, the plasma 64 can provide a heat that prevents the supplied parylene monomers from entering into undesired reactions outside of the first nozzle 3 before the deposition on the surface 11.

Figure 4:
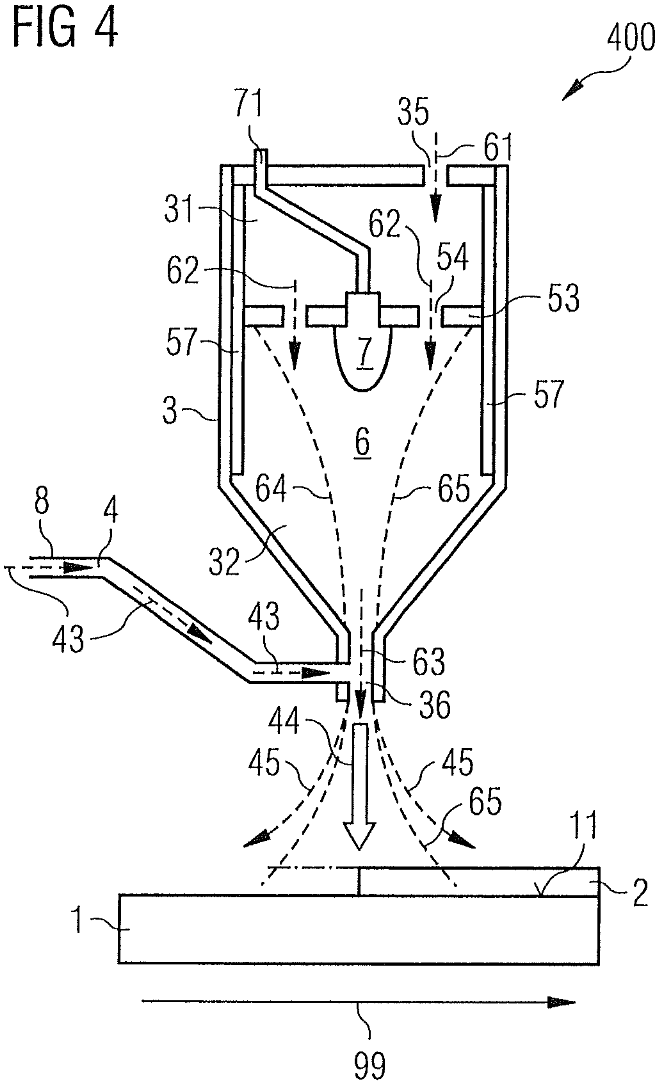

A device 400 according to a further example is shown in FIG. 4.

The device 400 has a first nozzle 3 which, like the second nozzle 5 of the previous example, is designed to produce a plasma 64 in a second gas 6, whereby a plasma flow 65 can emerge through the gas outlet opening 36 and can be supplied to the at least one surface 11 of the at least one component 1. As described above for the second nozzle 5 in FIG. 3, the first nozzle 3 inter alia has an electrode 7 with an electrical supply 71, an electrical insulation 57 as well as a separating wall 53 with openings 54 so that the plasma 64 and thus the plasma flow 65 of the second gas 6 can be generated in the second volume 32 of the first nozzle 3 as in the second nozzle 5 of the previous example.

Furthermore, the device 400 has a gas supply 8 in which first gas containing parylene monomers 4 generated and provided outside of the first nozzle 3 can be supplied to the plasma 64 of the second gas 6 in the first nozzle 3, as is indicated by the gas flow direction 43.

The first gas containing the parylene monomers 4 is generated in an external, evaporator element (not shown), which is shown in FIG. 5, for example, in connection with the example.

The first gas containing the parylene monomers 4 emerges through the gas outlet opening 36 together with the plasma flow 65 of the second gas 6 and is conducted together with the plasma flow 65 to the surface 11 of the component 1. The plasma flow 65 of the second gas 6 and the gas flow direction 45 of the first gas containing the parylene monomers 4 thereby overlap, whereby the processes described in FIG. 3 in connection with the previous example can take place simultaneously and in the same space and surface region. Additionally, the plasma 64 can produce a heat in the first nozzle 3 that prevents the supplied parylene monomers from already being able to enter into undesired reactions in the first nozzle and/or before the deposition on the surface 11. A control of the necessary temperature in the second volume 32 of the first nozzle 3 may thereby be possible, in particular by suitable process parameters for the plasma 64, without further heating elements being necessary in the second volume 32.

As an alternative to the example shown, the first gas containing parylene dimers can also be conducted directly into the plasma 64 of the second gas 6 by the gas supply 8 or the first gas containing parylene dimers can also be supplied to the first nozzle 3 together with the second gas 6 through the gas inlet 35. The plasma can then also be generated, for example, in the first and second gas 6. The parylene dimers can be cleaved to give parylene monomers by the heat and energy of the plasma 64.

As a further alternative to the example shown, it is also possible for only the first gas containing parylene dimers without the second gas 6 to be conducted through the gas inlet 35 into the first nozzle 3. The gas supply 8 is then not necessary. In the second volume 32, a plasma 64 can then be generated in the first gas and cleave the parylene dimers to give parylene monomers. The first gas can then be conducted to give the at least one surface 11 as a plasma flow 65 together with the parylene monomers.

In FIG. 5, a device 500 according to a further example is shown, which purely by way of example contains the first nozzle 3 according to the example in FIG. 4. Alternatively, the device 500 can also contain the first nozzle 3 according to the example in FIG. 2 or the first nozzle 3 and the second nozzle 5 according to the example in FIG. 3.

Furthermore, for generation of plasma in the second gas in the first nozzle 3 by an arc discharge, the device 500 has a plasma generator 72 designed as a high tension source and connected to the electrodes (not shown) of the first nozzle 3 via the electrical supply 71.

Furthermore, the device 500 has an evaporator element 48, in which parylene dimers in the first gas, which has atmospheric pressure, are evaporated and cleaved to give parylene monomers. As described in connection with FIG. 4, the first gas containing the parylene monomers is conducted into the plasma flow of the second gas in the first nozzle 3 by the gas supply 8.

Furthermore, the device 500 additionally has a waste gas system (not shown) to remove impurities and gases and gas constituents which are no longer needed from the evaporator element 48 and the device 500.

The device 500 is designed as a ribbon coating unit, a so-called "reel-to-reel" unit, and has a transport mechanism 9 in the form of transport rollers, by which a plurality of components 1 are moved along the transport direction 99 and transported past the first nozzle 3. The transport of the plurality of components 1 takes place continuously here in the example shown, which makes simple process management and a high throughput possible.

The plurality of components 1 are disposed on a metal band in the form of a leadframe assembly, which can be transported by the transport rollers of the transport mechanism 9. The leadframe assembly can be separated into individual components 1 after coating the components 1. As described further above, the components 1 in the example shown are designed as optoelectronic components with a silicone casting, wherein the at least one surface of the components 1 to be coated is formed by the silicone. Furthermore, further surfaces of the components 1 can also be coated.

The device 500 furthermore has a cover 10 having a hollow space 12 into which the first nozzle 3 projects such that the first gas containing the parylene monomers as well as the second gas shown in the example are introduced into the hollow space 12 as a plasma flow. The hollow space 12 is delimited by walls of the cover and open on half of one side. As is shown in FIG. 5, the hollow space 12 is open in the direction of the components 1 such that the first gas containing the parylene monomers conducted into the hollow space 12 and the plasma flow of the second gas is conducted to the components 1.

The cover 10 is disposed at a distance above the components 1 such that gas, that is the first and second gas in the example shown, can flow out again from the hollow space 12 between the cover 12, that is in particular between the walls delimiting the hollow space 12, and the components 1. The majority of the components 1 are thus not disposed in a closed system, but in an environment at atmospheric pressure. However, at the same time, the components 1 are protected during coating against harmful environmental influences by the cover 10 and the gas flowing out between the cover 10 and the components 1. In particular, undesired side reactions of the reactive parylene monomers, for example, with impurities in the surrounding air or with constituents of the surrounding air itself such as, for example, atmospheric oxygen can thereby also be avoided. The cover 10 is made of plastic in the example shown.

The examples of the method and the device shown in connection with the figures can alternatively or additionally have features, and combinations that are described in the general section.

The devices shown here and the method described makes it possible to mass-produce components provided with a parylene coating, the process throughput of which cannot be achieved using conventional low-pressure methods.

This disclosure is not restricted to the examples by the description. Rather, the methods and devices comprise any new feature and any combination of features, which in particular contains any combination of features in the appended claims, even if the feature or combination itself is not explicitly specified in the claims or examples.

The invention claimed is:

1. A method of producing a parylene coating on at least one surface of at least one component comprising:

providing a first gas containing parylene monomers, providing a second gas in which a plasma is generated and conducting the second gas external to a plasma generation device to the at least one surface as a plasma flow, and depositing the parylene monomers on the at least one surface of the component by supplying the first gas containing the parylene monomers by a first nozzle to the at least one surface, wherein the component is disposed in an environment at atmospheric pressure.

2. The method according to claim 1, wherein the at least one surface of the component is chemically activated by the plasma flow.

3. The method according to claim 1, wherein the first gas containing the parylene monomers is provided from an outside source to the first nozzle, the second gas is conducted by the first nozzle in which the plasma is generated, as a plasma flow to the at least one surface, and the first gas containing the parylene monomers is conducted to the plasma flow in the first nozzle.

4. The method according to claim 1, wherein the second gas is conducted to the at least one surface as a plasma flow by a second nozzle in which the plasma is generated.

5. The method according to claim 1, wherein the parylene monomers are produced by cleavage of parylene dimers in the first nozzle by a supply of heat and/or by a plasma in the first nozzle.

6. The method according to claim 1, wherein the at least one surface of the component is formed by silicone and/or a metal layer.

7. The method according to claim 1, wherein the first gas and/or the second gas contains air, nitrogen gas and/or an inert gas.

8. The method according to claim 1, further comprising:

disposing a cover above the at least one component, wherein the cover above the at least one component has a hollow space open in a direction to the component into which the first gas containing the parylene monomers is conducted.

9. The method according to claim 1, wherein the parylene monomers contain fluorine-substituted parylene monomers.

10. A method of producing a parylene coating on at least one surface of at least one component comprising:

providing a first gas containing parylene monomers, providing a second gas in which a plasma is generated and conducting the second gas external to a plasma generation device to the at least one surface as a plasma flow, and depositing the parylene monomers on the at least one surface of the component by supplying the first gas containing the parylene monomers by a first nozzle to the at least one surface, wherein the component is disposed in an environment at atmospheric pressure, wherein the parylene monomers contain fluorine-substituted parylene monomers.

* * * * *